US010090100B2

(12) United States Patent
Cheng

(10) Patent No.: US 10,090,100 B2
(45) Date of Patent: Oct. 2, 2018

(54) SWITCHING POWER SUPPLY, EMI FILTER, COMMON MODE INDUCTOR AND WRAPPING METHOD FOR THE COMMON MODE INDUCTOR

(71) Applicant: Delta Electronics (Jiangsu) Ltd., Wujiang, Jiangsu Province (CN)

(72) Inventor: Tangqian Cheng, Wujiang (CN)

(73) Assignee: Delta Electronics (Jiangsu) Ltd., Wujiang (CN)

( * ) Notice: Subject to any disclaimer, the term of this patent is extended or adjusted under 35 U.S.C. 154(b) by 199 days.

(21) Appl. No.: 14/697,349

(22) Filed: Apr. 27, 2015

(65) Prior Publication Data

US 2015/0349628 A1     Dec. 3, 2015

(30) Foreign Application Priority Data

Jun. 3, 2014  (CN) .......................... 2014 1 0242191

(51) Int. Cl.
*H01F 27/28* (2006.01)
*H01F 38/14* (2006.01)
(Continued)

(52) U.S. Cl.
CPC .............. *H01F 38/14* (2013.01); *H01F 3/10* (2013.01); *H01F 17/062* (2013.01); *H01F 27/28* (2013.01);
(Continued)

(58) Field of Classification Search
CPC ........................................... H01F 27/00–27/36
(Continued)

(56) References Cited

U.S. PATENT DOCUMENTS 1,784,833 A * 12/1930 Hagemann .............. H01F 17/08
                                                           336/185
1,897,604 A *  2/1933 Clemons ................. H04M 1/02
                                                           29/602.1
(Continued)

FOREIGN PATENT DOCUMENTS

CN         201039660 Y      3/2008
CN         202887903 U      4/2013
(Continued)

OTHER PUBLICATIONS

1st Office Action dated Dec. 12, 2016 by the CN Office.

*Primary Examiner* — Tuyen Nguyen
(74) *Attorney, Agent, or Firm* — Yunling Ren

(57) ABSTRACT

The present disclosure provides a switching power supply, an EMI filter, a common mode inductor and a wrapping method for the common mode inductor. The common mode inductor includes a first coil winding and a second coil winding. The wrapping method for a common mode inductor includes steps of: disposing two isolation blocking sheets at different positions of a magnetic core; wrapping the first coil winding around the magnetic core, wherein the first coil winding is divided into two wrapping areas by one of the isolation blocking sheets; wrapping the second coil winding around the magnetic core, wherein the second coil winding is divided into two wrapping areas by the other one of the isolation blocking sheets, wherein the first coil winding and the second coil winding are symmetrically wrapped.

4 Claims, 5 Drawing Sheets

(51) Int. Cl.
*H01F 3/10* (2006.01)
*H01F 17/06* (2006.01)
*H01F 27/32* (2006.01)
*H01F 41/08* (2006.01)
*H01F 27/245* (2006.01)
*H03H 7/42* (2006.01)
*H03H 1/00* (2006.01)
*H02M 1/12* (2006.01)

(52) U.S. Cl.
CPC ....... *H01F 27/2895* (2013.01); *H01F 27/324* (2013.01); *H01F 41/08* (2013.01); *H01F 27/245* (2013.01); *H01F 2003/106* (2013.01); *H02M 1/126* (2013.01); *H02M 2001/123* (2013.01); *H03H 7/427* (2013.01); *H03H 2001/0092* (2013.01); *Y10T 29/49073* (2015.01)

(58) Field of Classification Search
USPC ............................ 336/65, 200, 225–229, 232
See application file for complete search history.

(56) References Cited

U.S. PATENT DOCUMENTS

| | | | | |
|---|---|---|---|---|
| 3,389,703 | A * | 6/1968 | Criswell | A61N 1/04 607/119 |
| 5,525,951 | A * | 6/1996 | Sunano | H01F 37/00 336/160 |
| 6,300,857 | B1 * | 10/2001 | Herwig | H01F 27/2895 336/198 |
| 7,474,193 | B2 * | 1/2009 | Na | H01F 17/062 336/229 |
| 8,618,903 | B2 * | 12/2013 | Fornasari | H01F 3/12 336/229 |
| 8,841,985 | B2 * | 9/2014 | Feist | H01F 17/062 336/229 |
| 2006/0158814 | A1 * | 7/2006 | Wasaki | H03H 7/09 361/118 |

FOREIGN PATENT DOCUMENTS

| | | | |
|---|---|---|---|
| JP | 02060117 | A * | 2/1990 |
| JP | 08078254 | A * | 3/1996 |
| JP | 2009176993 | A | 8/2009 |

* cited by examiner

SWITCHING POWER SUPPLY, EMI FILTER, COMMON MODE INDUCTOR AND WRAPPING METHOD FOR THE COMMON MODE INDUCTOR

CROSS REFERENCE TO RELATED APPLICATIONS

This application is based upon and claims the benefit of priority from the prior Chinese Patent Application No. 201410242191.2 filed on Jun. 3, 2014, entitled "SWITCHING POWER SUPPLY, EMI FILTER, COMMON MODE INDUCTOR AND WRAPPING METHOD FOR THE COMMON MODE INDUCTOR", before Chinese State Intellectual Property Office, under 35 U.S.C. § 119. The content of the above prior Chinese Patent Application is incorporated herein by reference in its entirety.

TECHNICAL FIELD

The present disclosure generally relates to the technical field of ElectroMagnetic Interference (EMI) suppression, and more particularly, to a wrapping method for a common mode inductor, a common mode inductor prepared using the wrapping method, and an EMI filter and a switching power supply which use the common mode inductor.

BACKGROUND

A switching power supply is a power supply which maintains a stable output voltage by controlling a ratio of on-to-off time of a switch. Currently, switching power supply products are developing towards a direction of small type and high frequency, which results in difficulties in improvement of EMI noise in switching power supply products. A common mode inductor, as one of main components for suppressing EMI noise in a switching power supply, self characters of which have obvious influence on EMI noise suppression.

As shown in FIG. 1, an equivalent circuit diagram of a common mode inductor is illustrated. As shown in FIG. 2, a schematic structure diagram of a common mode inductor in conventional technologies is shown. The common mode inductor mainly includes a closed magnetic core 102 and two coil windings 101 symmetrically wrapped around the closed magnetic core 101. However, the EMI noise suppression capability of the common mode inductor still needs to be enhanced, which hampers the development of switching power supplies towards a direction of small type and high frequency.

SUMMARY

The present disclosure provides a wrapping method for a common mode inductor in order to better form an isolation gap in coil windings. Further, the present disclosure provides a common mode inductor prepared using the wrapping method for the common mode inductor, and an EMI filter and a switching power supply which use the common mode inductor.

Other properties and advantages of the present disclosure will become clear from the detailed description below, or may be partly appreciated by practice of the present disclosure.

According to a first aspect of the present disclosure, a wrapping method for a common mode inductor is provided. The common mode inductor includes a first coil winding and a second coil winding. The method includes steps of: disposing two isolation blocking sheets at different positions of a magnetic core; wrapping the first coil winding around the magnetic core, wherein the first coil winding is divided into two wrapping areas by one of the isolation blocking sheets; and wrapping the second coil winding around the magnetic core, wherein the second coil winding is divided into two wrapping areas by the other one of the isolation blocking sheets. The first coil winding and the second coil winding are symmetrically wrapped.

In an embodiment of the present disclosure, after symmetrical wrapping of the two coil windings around the magnetic core, the method further includes taking off the isolation blocking sheets.

In an embodiment of the present disclosure, the isolation blocking sheets are magnetic or include a ferromagnetic material, and magnetic absorption force exists between the isolation blocking sheets and the magnetic core.

In an embodiment of the present disclosure, the isolation blocking sheets are of non magnetic materials, and the isolation blocking sheets are assembled to the magnetic core in a snap-fit manner, or adhered to the magnetic core.

In an embodiment of the present disclosure, the isolation blocking sheets have a "⌐" shape or a "L" shape.

In an embodiment of the present disclosure, the isolation blocking sheets are of an integrated structure or are constructed by stacking a plurality of thin sheet structures.

In an embodiment of the present disclosure, the isolation blocking sheets have a thickness which is set depending on a size of an isolation gap to be formed.

In an embodiment of the present disclosure, the isolation blocking sheets have a thickness of 0.5 mm~5 mm.

In an embodiment of the present disclosure, the magnetic core is a closed-loop-shaped magnetic core or a closed-polygon-shaped magnetic core.

According to a second aspect of the present disclosure, a common mode inductor prepared using the wrapping method for the common mode inductor according to the first aspect of the present disclosure is provided.

According to a third aspect of the present disclosure, an EMI filter is provided. The EMI filter includes an anti-EMI filter circuit composed of resistors, inductors and capacitors which are coupled in series or parallel. The inductor includes the common mode inductor according to the second aspect of the present disclosure.

According to a fourth aspect of the present disclosure, a switching power supply is provided. The switching power supply includes the common mode inductor according to the second aspect of the present disclosure.

In the wrapping method for a common mode inductor provided by embodiments of the present disclosure, an isolation blocking sheet is disposed at two different positions of the magnetic core in advance respectively; during the wrapping procedure, an isolation gap is formed in each coil winding by using the isolation blocking sheets, so as to divide each coil winding into two wrapping areas.

On one hand, during the wrapping procedure, the isolation blocking sheets may maintain the shape of the isolation gap to avoid deformation of the isolation gap, and the size of the isolation gap may be stably controlled by selecting the thicknesses of the isolation blocking sheets. Thus, not only the EMI noise suppression capability of the common mode inductor may be improved, but also products properties become stable. On the other hand, with the leading and assistance of the isolation blocking sheets, it is more convenient for wrapping operation, which brings benefits for increase of production efficiencies; and the isolation blocking sheets may be reused, which may reduce production costs of the common mode inductor.

In addition, since the common mode inductor prepared using the above wrapping method for the common mode inductor has enhanced EMI noise suppression capability, it is possible to provide better EMI suppression capability for a switching power supply or an EMI filter, thus less dependency on other EMI suppression components may be achieved, and consequently, the EMI filter may have a simpler structure design, which saves space and production costs.

BRIEF DESCRIPTION OF THE DRAWINGS

The above and other features and advantages of the present disclosure will become clear from detailed description of exemplary embodiments with reference to accompanying drawings.

DESCRIPTION OF REFERENCE NUMBERS

Figure 1:
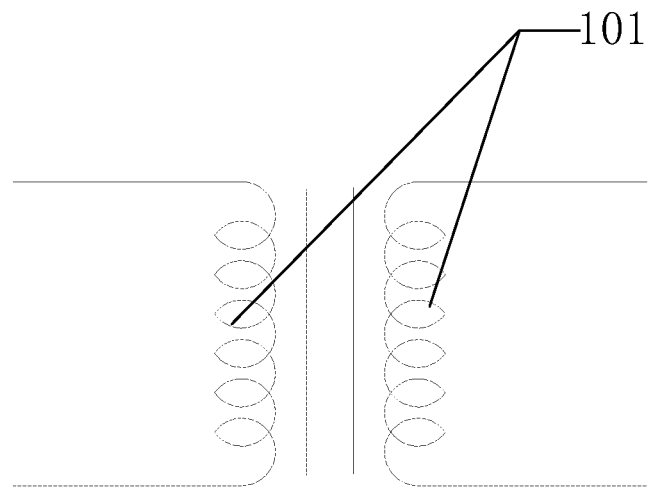
FIG. 1 is an equivalent circuit diagram of a common mode inductor.
Figure 2:
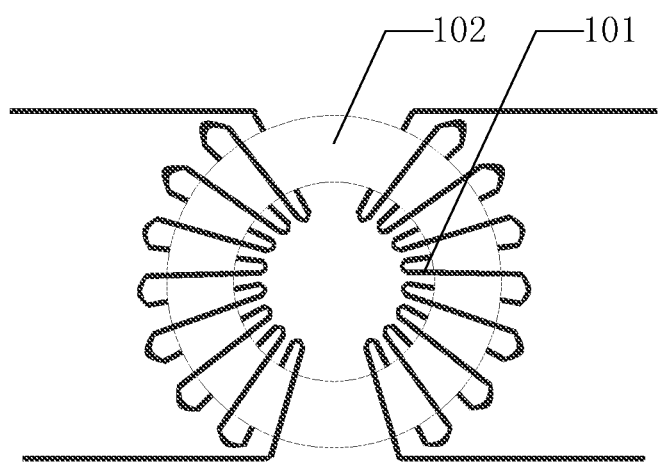
FIG. 2 is a schematic structure diagram of a common mode inductor in conventional technologies.

101: coil winding
1011: first wrapping area
1012: second wrapping area
101A: first coil winding
101B: second coil winding
102: closed magnetic core
103: isolation gap
104: isolation blocking sheet
H: thickness of the isolation blocking sheet
W: opening width of the isolation blocking sheet
S101~S103: steps

DETAILED DESCRIPTION

Now, exemplary implementations will be described more comprehensively with reference to the accompanying drawings. However, the exemplary implementations may be carried out in various manners, and shall not be interpreted as being limited to the implementations set forth herein; instead, providing these implementations will make the present disclosure more comprehensive and complete and will fully convey the conception of the exemplary implementations to the ordinary skills in this art. In the drawings, thicknesses of areas and layers are exaggerated for the sake of clarity. Throughout the drawings similar reference numbers indicate the same or similar structures, and their detailed description will be omitted.

The features, structures or characteristics described herein may be combined in one or more embodiments in any suitable manner. In the following description, many specific details are provided to facilitate sufficient understanding of the embodiments of the present disclosure. However, the ordinary skills in this art will appreciate that the technical solutions in the present disclosure may be practiced without one or more of the specific details, or by employing other methods, elements, materials and so on. In other conditions, well-known structures, materials or operations are not shown or described in detail so as to avoid confusion of respective aspects of the present disclosure.

In order to improve EMI noise suppression capabilities of a common mode inductor, an embodiment relates to forming an isolation gap in every coil winding, i.e., dividing one coil winding into two wrapping areas. That is to say, finally, the common mode inductor structure shown in FIG. 3 needs to be achieved, in which every coil winding 101 includes a first wrapping area 1011 and a second wrapping area 1012 which are divided by an isolation gap 103.

Figure 3:
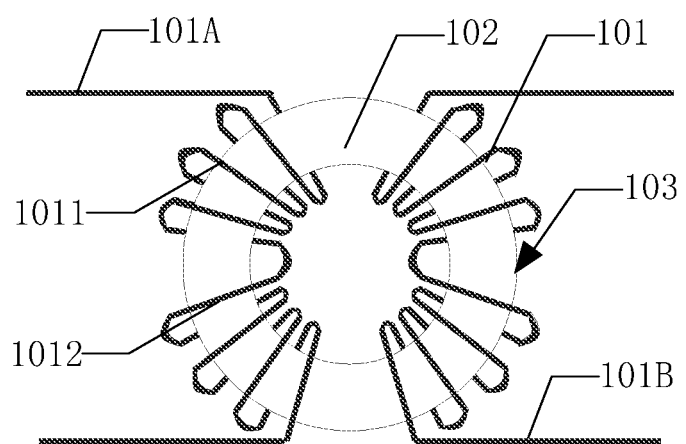
FIG. 3 is a schematic structure diagram of a common mode inductor to be achieved by the present disclosure.
Figure 4:
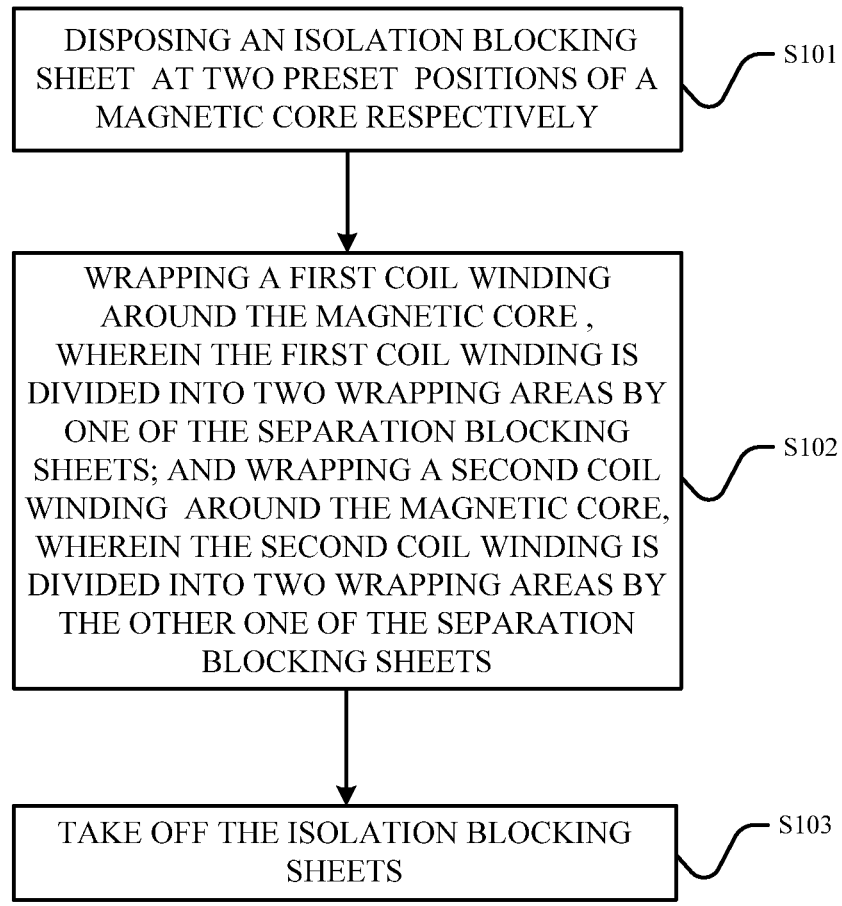
FIG. 4 is a schematic flowchart showing a wrapping method for a common mode inductor according to an exemplary embodiment of the present disclosure.

In order to achieve the common mode inductor structure shown in FIG. 3, the only method is to reserve an isolation gap by experience of workers after they have wrapped the first wrapping area 1011, and then the second wrapping area 1012 is wrapped.

However, during the wrapping procedure, wires may become saggy and thus the reserved isolation gap may deform as the advancing of the wrapping procedure and finally disappear. Thus it is only increasing operation steps, but no benefit may be brought to improvement of the EMI noise suppression capability of the common mode inductor. Or, even if the reserved isolation gap may be maintained after completion of the wrapping, it is difficult to maintain the size of this isolation gap to be in consistency with its original size (the original size is reserved only by experience and may not be set accurately), i.e., the size of the isolation gap may not be controlled, resulting in instability in product properties.

In the exemplary embodiment, a wrapping method for a common mode inductor is provided at first. As shown in FIGS. 4~8, the wrapping method for a common mode inductor mainly includes the following steps.

In step S101, two isolation blocking sheets are disposed at different positions of a magnetic core. In the exemplary embodiment, explanation will be made using a closed magnetic core as an example. However, the magnetic core may also be an unclosed magnetic core, and the present disclosure is not limited to this.

In step S102, a first coil winding 101A is wrapped around the magnetic core 102, wherein the first coil winding 101A is divided into two wrapping areas by one of the separation blocking sheets; a second coil winding 101B is wrapped around the magnetic core 102, wherein the second coil winding 101B is divided into two wrapping areas by the other one of the separation blocking sheets. The second coil winding 101B and the first coil winding 101A are symmetrically wrapped. It shall be noted that the present disclosure does not impose specific limitations on the wrapping sequence of the first coil winding 101A and the second coil winding 101B.

In addition to the above steps, the method further includes Step S103.

In step S103, the isolation blocking sheets are taken down. It shall be noted that not taking down the isolation blocking sheets is also applicable, which depends on actual conditions.

The above steps will be described in detail with reference to FIGS. 5~8.

Figure 5:
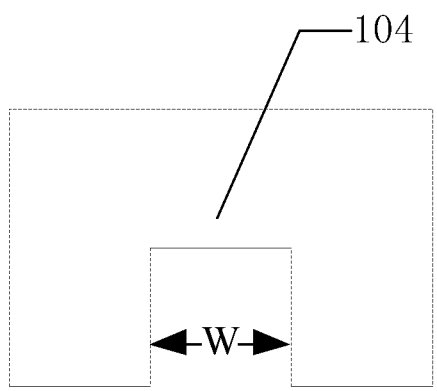
FIG. 5 is a schematic structure diagram of an isolation blocking sheet according to an exemplary embodiment of the present disclosure.
Figure 6:
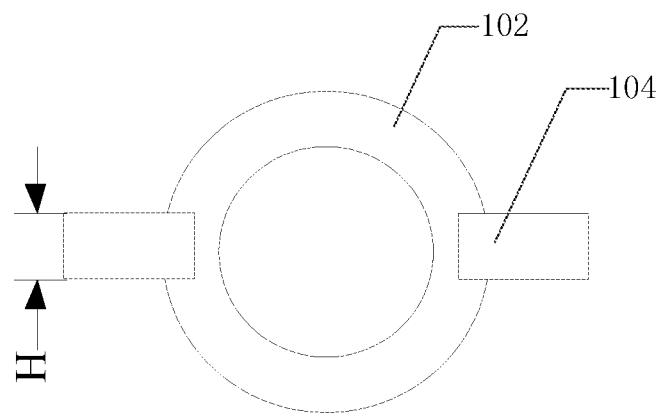
FIG. 6 is a schematic structure diagram after an assemblage of the isolation blocking sheet in FIG. 5 with a closed magnetic core.

FIG. 5 is a schematic structure diagram of an isolation blocking sheet according to an exemplary embodiment of the present disclosure. As shown in FIG. 5, an isolation blocking sheet 104 has a "⊔" shape or other similar shapes such as "U" shape or a "C" shape or a swallow tail shape. An opening width W of the isolation blocking sheet is substantially the same as a thickness of the closed magnetic core, and thus the isolation blocking sheet 104 may be assembled to the closed magnetic core in a snap-fit manner. As shown in FIG. 6, it is a schematic structure diagram after an assemblage of the isolation blocking sheet 104 with the closed magnetic core 102 in a snap-fit manner. It shall be noted that although the closed magnetic core 102 shown is a closed-ring-loop-shaped magnetic core, the present disclosure is not limited to this and a closed-polygon-shaped (e.g., rectangular-shaped) magnetic core or a closed magnetic core 102 having other shapes are also applicable.

The material of the isolation blocking sheet 104 may be non magnetic material (such as organic material or alloy material) which may be coupled to the closed magnetic core 102 in a snap-fit manner or may be adhered to the closed magnetic core 102. In addition, considering the magnetic material of the closed magnetic core 102, the isolation blocking sheet 104 may also be formed of a magnetic material, i.e., the isolation blocking sheet 104 is magnetic. Indeed, the isolation blocking sheet 104 may also be made by ferromagnetic material. Thus, magnetic absorption force exists between the isolation blocking sheet 104 and the closed magnetic core 102, such that the isolation blocking sheet 104 may be fitted onto the closed magnetic core 102 by using this magnetic absorption force. Thus, the shape of the isolation blocking sheet 104 may be not limited to the above "⊔" shape, but may also be "L" shapes and so on. For example, when the isolation blocking sheet has a relatively large thickness H, due to a large contact area with the closed magnetic core 102, the applied force is more sufficient. Thus, "L" shapes may be selected. When the isolation blocking sheet has a relatively small thickness H, a "U" shape may be selected to fix the isolation blocking sheet 104 by using a snap-fit force and a magnetic absorption force.

The thickness H of the isolation blocking sheet may be set depending on a size of the isolation gap to be formed. For example, a width of the isolation gap may be set as 0.5 mm~5 mm. For example, if a width of the isolation gap to be formed is 1 mm, the thickness H of the isolation blocking sheet needs to be set as 1 mm; if a width of the isolation gap to be formed is 2 mm, the thickness H of the isolation blocking sheet needs to be set as 2 mm, and so on.

The isolation blocking sheet 104 may be of an integrated structure, and the thickness of the isolation blocking sheet 104 may be determined when the isolation blocking sheet 104 is molded; or, for convenient adjustment of the thickness of the isolation blocking sheet 104, the isolation blocking sheet 104 may be constructed by stacking a plurality of thin sheet structures. For example, when a thickness of every thin sheet structure is 0.5 mm and a 2 mm-isolation blocking sheet 104 is needed, it only needs to stack 4 such thin sheet structures together. The connection manner between such thin sheet structures may be an adhesive connection, or may be a magnetic connection, and the present disclosure does not impose special limitations on this.

Figure 7:
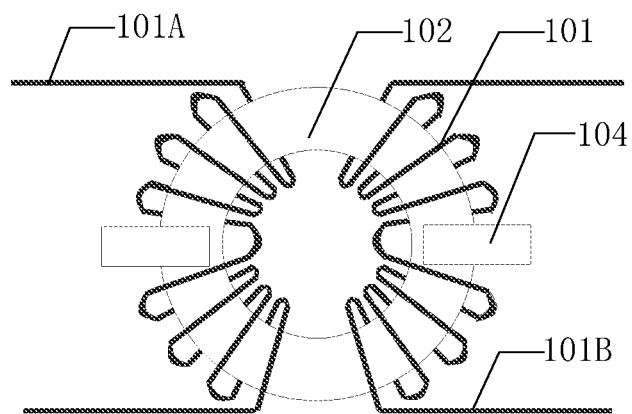
FIG. 7 is a schematic structure diagram after a wrapping around the closed magnetic core in FIG. 6.

After the isolation blocking sheets 104 is disposed at preset positions of the closed magnetic core 102, one coil winding may be wrapped around two half-rings of the closed magnetic core 102 respectively, and the wire diameter and the number of turns of the two coil windings are the same. As shown in FIG. 7, a schematic structure diagram after a wrapping is shown. It can be seen that, during the wrapping procedure, the isolation blocking sheets 104 may maintain the shape of the isolation gap so as to avoid deformation of the isolation gap, and the size of the isolation gap may be stably controlled by selection of the thicknesses of the isolation blocking sheets 104. In addition, with the leading and assistance of the isolation blocking sheets 104, it is more convenient for wrapping operation, which brings benefits for increase of production efficiencies.

Figure 8:
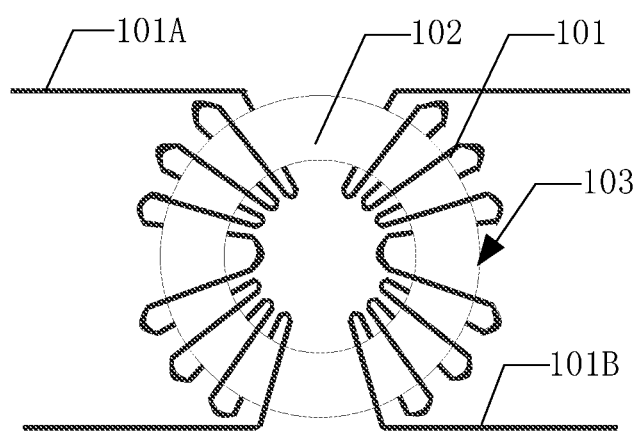
FIG. 8 is a schematic structure diagram of a common mode inductor prepared using the wrapping method for the common mode inductor of the present disclosure.

As shown in FIG. 8, after completion of wrapping, the isolation blocking sheets 104 may be taken off, and then an isolation gap 103 having a stable shape and a preset size is finally left. Thus, not only the EMI noise suppression capability of the common mode inductor is increased, but also stability of product property is obtained. Indeed, the isolation blocking sheets 104 may not be taken from the closed magnetic core 102 after completion of wrapping, so as to further ensure that the formed isolation gap 103 does not deform during usage of the common mode inductor and thus reliability of product performance is increased.

In an exemplary embodiment, a common mode inductor prepared by the above wrapping method for the common mode inductor is provided. According to the description of the above wrapping method for the common mode inductor, it can be known that, an isolation gap is formed in every coil winding of the common mode inductor, and the shape and the size of the isolation gap are in consistence with preset shape and size. Thus, by this common mode inductor, the EMI noise suppression capability of the common mode inductor may be improved and stable product properties may be achieved.

In an exemplary embodiment, an EMI filter is also provided. The EMI filter includes an anti-EMI filter circuit composed of inductors, capacitors and resistors which are coupled in series or parallel. The inductors include the above common mode inductor. Since the above common mode inductor has enhanced EMI noise suppression capability, it is possible to provide better EMI suppression capability for the EMI filter, and less dependency on other EMI suppression components may be achieved (e.g., the number of capacitors in the integrated filter circuit may be reduced and the capacitance amount may be decreased). Consequently, the EMI filter may have a simple structure design, such that space and production costs may be saved, which brings benefits for development of the EMI filter towards a direction of small type and high frequency.

In an exemplary embodiment, a switching power supply is provided. The switching power supply may be any power supply which is achieved by controlling on and off of a switch. For example, the switching power supply may be an Uninterruptible Power System (UPS), a communication power supply or a welding power supply, etc. One of the biggest distinctions between the switching power supply in the present disclosure and that in the conventional technologies is that the switching power supply in the present disclosure includes the above common mode inductor. Since the above common mode inductor has enhanced EMI noise suppression capability, it is possible to provide better EMI suppression capability for the switching power supply, and less dependency on other EMI suppression components may be achieved (e.g., the number of capacitors in the integrated switching power supply may be reduced and the capacitance amount may be decreased). Consequently, the switching power supply may have a simple structure design, such that space and production costs may be saved, which brings benefits for development of the switching power supply towards a direction of small type and high frequency.

The present disclosure is described with the above exemplary embodiments which are only examples for implementing the present disclosure. It shall be pointed out that the disclosed embodiments do not limit the scope of the present disclosure. Instead, modifications and variations without departing from the spirit and scope of the present disclosure fall into the protection scope of the present disclosure.

What is claimed is:

1. A common mode inductor, comprising a first coil winding, a second coil winding, a magnetic core and two isolation blocking sheets, wherein,
   the two isolation blocking sheets are disposed at different positions of the magnetic core, and the two isolation blocking sheets are magnetic, and magnetic absorption force exists between the isolation blocking sheets and the magnetic core, such that the isolation blocking sheets are fitted onto the magnetic core by using the magnetic absorption force, so as to wrap the first coil winding and the second coil winding;
   the first coil winding is wrapped around the magnetic core, and divided into two wrapping areas by one of the isolation blocking sheets,
   the second coil winding is wrapped around the magnetic core, and divided into two wrapping areas by the other one of the isolation blocking sheets, and
   the first coil winding and the second coil winding are symmetrically wrapped.

2. The common mode inductor according to claim 1, wherein,
   after the two coil windings are symmetrically wrapped around the magnetic core, the isolation blocking sheets are taken off.

3. The common mode inductor according to claim 1, wherein the isolation blocking sheets have a "⌣" shape or a "L" shape.

4. The common mode inductor according to claim 1, wherein the isolation blocking sheets are of an integrated structure or are constructed by stacking a plurality of thin sheet structures.

* * * * *